(12) United States Patent
Dong et al.

(10) Patent No.: US 7,366,969 B2
(45) Date of Patent: Apr. 29, 2008

(54) SYSTEM AND METHOD FOR IMPLEMENTING A REED SOLOMON MULTIPLICATION SECTION FROM EXCLUSIVE-OR LOGIC

(75) Inventors: Qiujie Dong, Plano, TX (US); Andrew J. Thurston, Allen, TX (US)

(73) Assignee: Cisco Technology, Inc., San Jose, CA (US)

( * ) Notice: Subject to any disclaimer, the term of this patent is extended or adjusted under 35 U.S.C. 154(b) by 445 days.

(21) Appl. No.: 10/960,836

(22) Filed: Oct. 7, 2004

(65) Prior Publication Data
US 2006/0090119 A1 Apr. 27, 2006

(51) Int. Cl.
*H03M 13/00* (2006.01)
(52) U.S. Cl. ...................................... 714/784
(58) Field of Classification Search ................. 714/784
See application file for complete search history.

(56) References Cited
U.S. PATENT DOCUMENTS 5,946,328 A * 8/1999 Cox et al. .................. 714/784

6,990,624 B2 * 1/2006 Dohmen et al. ............. 714/785

OTHER PUBLICATIONS

Gao et al., Custom VLSI design of efficient low latency and low power finite field multiplier for Reed Solomon Codec, 2001, IEEE, p. 574-577.*
Hsu et al., A comparison ov VLSI architecture of finite filed multipliers using dual, normal, or standard bases, Jun. 1998, IEEE Trans. on Computers, vol. 37, No. 6, p. 735-739.*

* cited by examiner

*Primary Examiner*—Shelly A Chase
(74) *Attorney, Agent, or Firm*—Campbell Stephenson LLP; Brenna A. Brock

(57) ABSTRACT

Various methods and systems for implementing Reed Solomon multiplication sections from exclusive-OR (XOR) logic are disclosed. For example, a system includes a Reed Solomon multiplication section, which includes XOR-based logic. The XOR-based logic includes an input, an output, and one or more XOR gates. A symbol X is received at the input of the XOR-based logic. The one or more XOR gates are coupled to generate a product of a power of $\alpha$ and X at the output, wherein $\alpha$ is a root of a primitive polynomial of a Reed Solomon code. Such a Reed Solomon multiplication section, which can include one or more multipliers implemented using XOR-based logic, can be included in a Reed Solomon encoder or decoder.

32 Claims, 5 Drawing Sheets m = Symbol Size
t = Maximum number of symbol errors that can be detected
n = $2^m - 1$

SYSTEM AND METHOD FOR IMPLEMENTING A REED SOLOMON MULTIPLICATION SECTION FROM EXCLUSIVE-OR LOGIC

FIELD OF THE INVENTION

This invention relates to error codes and, more particularly, to Reed Solomon encoders and decoders.

BACKGROUND

Forward error correction (FEC) is often incorporated into a data stream in order to decrease the bit error rate. FEC adds additional information to the data stream to detect and correct any errors that are caused by the transmission system. The additional information is added to each message in a systematic way so that the resultant code words have a one-to-one relation to the messages. For every valid codeword there is one and only one message. For example, for an 8-bit message, one bit of additional information is added in the form of an even parity bit. The message (1 0 1 0 1 0 0 0) becomes the codeword (1 0 1 0 1 0 0 0 1). Therefore, the codeword (0 1 1 0 1 0 0 0 0) is not a valid codeword, even though it is 9 bits long just like the other codeword. In this example, the resultant codeword supports $2^9$ possible bit patterns, but only $2^8$ of those patterns are valid.

Algorithms used for FEC include convolutional codes, Hamming codes, and BCH (Bose-Chaudhuri-Hocquenghem) codes. BCH codes form a large class of powerful random error-correcting cyclic codes, and have the advantage of being robust and very efficient in terms of the relatively low number of check bits required. Reed Solomon codes are an example of a class of BCH codes. BCH codes are specified with three primary parameters, n, k, and t, where n=block length (the length of the message bits plus the additional check bits), k=message length (the number of data bits included in a check block), and t=correctable errors (the number of errors per block which the code can correct).

Galois field or finite field mathematics is the mathematical foundation for BCH-based forward error correction. A Galois field is a type of field extension obtained from considering the coefficients and roots of a given polynomial (also known as the root field). The generator polynomial for a t-error correcting BCH code is specified in terms of its roots from the Galois field $GF(2^m)$. If $\alpha$ represents the primitive symbol in $GF(2^m)$, then the generator polynomial g(x) for a t-error correcting BCH code of length $2^m-1$ is the lowest-degree polynomial which has $\alpha, \alpha^2, \alpha^3, \ldots, \alpha^{2t}$ as its roots, i.e., $g(\alpha^i)=0$ for $1 \leq i \leq 2t$. It can be shown from the foregoing that g(x) must be the least common multiple (LCM) of $\phi1(x), \phi3(x), \ldots, \phi2t-1(x)$, where $\phi i(x)$ is the minimal polynomial of $\alpha^i$.

Decoding of BCH codes likewise requires computations using Galois field arithmetic. Galois field arithmetic can be implemented (in either hardware or software) more easily than ordinary arithmetic because there are no carry operations; however, error decoders can nevertheless require a significant amount of logic to implement.

The first step in decoding a t-error correction BCH code is to compute the 2t syndrome components $S_1, S_2, \ldots, S_{2t}$. For a hardware implementation, these syndrome components may be computed with feedback registers that act as a multiply-accumulator (MAC). Since the generator polynomial is a product of, at most, t minimal polynomials, it follows that, at most, t feedback shift registers (each consisting of at most m stages) are needed to form the 2t syndrome components, and it takes n clock cycles to complete those computations. It is also necessary to find the error-location polynomial that involves roughly $2t^2$ additions and $2t^2$ multiplications. Finally, it is necessary to correct the error(s) which, in the worst case (for a hardware implementation), requires t multipliers shifted n times.

Accordingly, circuits that implement BCH codes are typically either quite complex, or require many operations. For example, the BCH-3 iterative algorithm requires up to five separate steps, with each step involving a varying number of computations, and any hardware implementation of BCH-3 must support the maximum possible number of steps/computations. Implementation of the calculations in electronic circuits can be accomplished with serial based hardware. However, performing calculations serially can take multiple clock cycles for operations to complete. Usage of serial techniques to perform many Galois field operations, including multiplication and division, may not meet system performance goals and may require the use of parallel techniques. The design and implementation of parallel circuitry to perform the calculations is often tedious and error prone. As the above examples show, improved techniques for implementing BCH circuits are desirable.

SUMMARY

Various embodiments of methods and systems for implementing Reed Solomon multiplication sections from exclusive-OR (XOR) logic are disclosed. In some embodiments, a system includes a Reed Solomon multiplication section, which includes XOR-based logic. The XOR-based logic includes an input, an output, and one or more XOR gates. A symbol X is received at the input of the XOR-based logic. The one or more XOR gates are coupled to generate a product of a power of $\alpha$ and X at the output, wherein $\alpha$ is a root of a primitive polynomial of a Reed Solomon code. Such a Reed Solomon multiplication section, which can include one or more multipliers implemented using XOR-based logic, can be included in a Reed Solomon encoder or decoder.

In some embodiments, a method involves receiving a symbol X and calculating a product of X and a power of $\alpha$. The product is calculated by XOR-based logic. The XOR-based logic comprises an input, an output, and one or more XOR gates. The XOR gates are coupled to receive X at the input and to generate a product of a power of $\alpha$ and X at the output, where $\alpha$ is a root of a primitive polynomial of a Reed Solomon code.

In other embodiments, a method involves generating information, which indicates one or more XOR equations, and storing the information. The XOR equations calculate a product Y of X and a power of $\alpha$, where $\alpha$ is a root of a primitive polynomial of a Reed Solomon code. Such a method generates the equations to be implemented by an XOR-based multiplier. If, for example, Y includes m bits, Y[m:0], the information indicates m XOR equations, and each of the m XOR equations calculates a respective Y[i], where $0<=i<=m-1$. The information can be generated in response to receiving input indicating the power of $\alpha$. Generating the information indicating the equations can involve identifying a linear sum of a one or more $\alpha^i$, where $0<=i<=n-1$ and the linear sum equals the power of $\alpha$. Alternatively, generating the information indicating the equations can involve combining equations used to generate respective products of X and each of the one or more $\alpha^i$.

The foregoing is a summary and thus contains, by necessity, simplifications, generalizations and omissions of detail;

consequently, those skilled in the art will appreciate that the summary is illustrative only and is not intended to be in any way limiting. The operations disclosed herein may be implemented in a number of ways, and such changes and modifications may be made without departing from this invention and its broader aspects. Other aspects of the present invention, as defined solely by the claims, will become apparent in the non-limiting detailed description set forth below.

BRIEF DESCRIPTION OF THE DRAWINGS

A more complete understanding of the present invention may be acquired by referring to the following description and the accompanying drawings, in which like reference numbers indicate like features.

Figure 1:
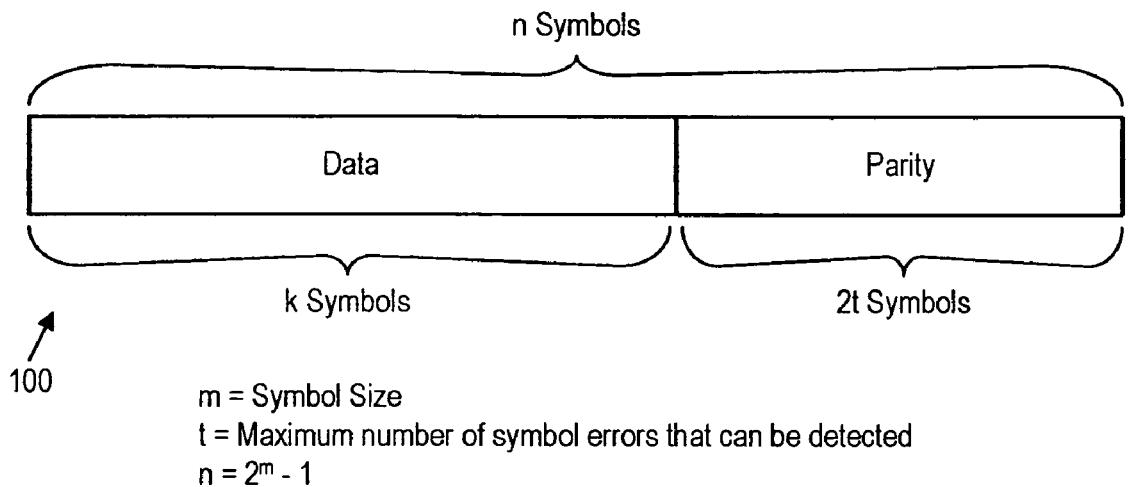
FIG. 1 illustrates a Reed Solomon code word.

While the invention is susceptible to various modifications and alternative forms, specific embodiments of the invention are provided as examples in the drawings and detailed description. It should be understood that the drawings and detailed description are not intended to limit the invention to the particular form disclosed. Instead, the intention is to cover all modifications, equivalents and alternatives falling within the spirit and scope of the invention as defined by the appended claims.

DETAILED DESCRIPTION

Reed Solomon encoders and decoders include multiplication sections that perform Galois field multiplication on incoming message data. Such multiplication sections are implemented using exclusive-OR (XOR) logic, as described below, instead of general-purpose Galois field multipliers. By using XOR logic to implement each multiplication section (as opposed to using general-purpose Galois field multipliers), the size and complexity of the multiplication section can be reduced. Such reductions in size and complexity allow the multiplication sections implemented using XOR logic to be used in high speed and/or high density systems.

Reed Solomon Codes are a subclass of the Bose, Chaudhuri, and Hocquenghem (BCH) class of random error correcting code. FIG. 1 shows an example of a Reed Solomon code word 100. As shown, Reed Solomon code word 100 includes n symbols, each of which is m bits in size. The data portion of code word 100 includes k symbols, while the parity portion of code word 100 includes 2t symbols. The number of symbols, n, in the code word is equal to $2^m-1$. The number of parity symbols, 2t, is determined by the difference between m and n (i.e., m−n=2t).

The error code used to generate code word 100 of FIG. 1 can detect and correct up to t errors within a given code word. For example, for a Reed Solomon code RS(n, k) where n=255 and k=239 (referred to as RS(255,239)), t=8. Thus, the RS(255, 239) algorithm can correct up to 8 errors within a code word.

Figure 2:
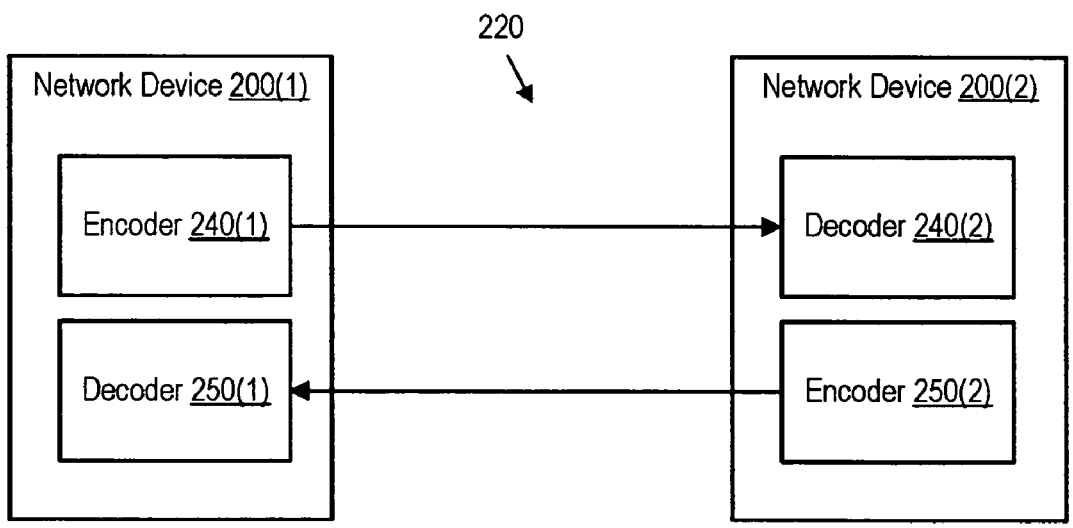
FIG. 2 is a block diagram of a typically communication system.

FIG. 2 illustrates a system that uses Reed Solomon codes when transmitting information. Two network devices 200(1) and 200(2) are coupled by a transmission medium 220. In this example, each network device can both send data to and receive data from the other network device. Accordingly, each network device includes both an encoder and a decoder. Network device 200(1) includes encoder 240(1) and decoder 250(1). Similarly, network device 200(2) includes encoder 240(2) and decoder 250(2). Encoders 240(1) and 240(2) operate similarly and are collectively referred to as encoders 240. Likewise, decoders 250(1) and 250(2) operate similarly and are collectively referred to as decoders 250.

Each encoder 240 receives data (e.g., from an internal data source within the network device) and uses a particular Reed Solomon algorithm to encode that data into a code word. Encoding the data involves generating parity for the data and appending the parity to the data to form a code word. The resulting code word can then be transmitted via a transmission medium to another network device. As described in more detail below, each encoder 240 can include a Reed Solomon multiplication section that is implemented from XOR logic instead of a general purpose Galois field multiplier.

Each decoder 250 receives a code word via a transmission medium and uses the parity within the code word to verify and/or correct the data within the code word. The decoder then provides the verified and/or corrected data to an internal data sink within the network device. As described in more detail below, each decoder 250 can include one or more multiplication sections that are implemented from XOR logic instead of general purpose Galois field multipliers.

Reed Solomon (RS) codes are based upon Galois fields (GF), where GF(s) denotes a Galois field having s elements. Reed Solomon codes that operate on binary messages are implemented using $GF(2^m)$, where m is the number of bits in each symbol. For example, RS (255,239) code is based upon $GF(2^8)$. $GF(2^8)$ consists of 256 eight-bit symbols, which are generated from the binary primitive polynomial $p(x) = x^8+x^4+x^3+x^2+1$.

The symbols within a $GF(2^8)$ can be represented as a combination of $\alpha^i$, i=0, 1, . . . , 7, where α is a root of the generator polynomial p(x) for $GF(2^8)$. In general, each symbol in a Galois field can be described in polynomial format as a linear sum of powers of primitive symbol a (i.e., $\alpha^0, \alpha^1, \ldots, \alpha^{m-1}$). Each symbol can also be represented as m-bit binary data. For example, in $GF(2^8)$, each of the 256 symbols can be represented as 8-bit binary data, X[7:0]. Accordingly, in $GF(2^8)$, each of the 256 symbols corresponds to one of the possible values of a byte of message data. In the binary representation of each symbol, X[i] is a coefficient of d in the corresponding polynomial representation of that symbol. Thus, the eight-bit binary value 00110000 represents the symbol that is described by the linear sum $0*\alpha^7+0*\alpha^6+1*\alpha^5+1*\alpha^4+0*\alpha^3+0*\alpha^2+0*\alpha^1+0*\alpha^0=\alpha^5+\alpha^4$.

It has been discovered that, when representing the symbols in binary format, each symbol can be calculated based on the value of a previous symbol, using purely XOR logic.

For example, for each symbol in GF($2^8$), each symbol $D_{i+1}[7:0]$, where i=0, 1, ..., 255, can be generated from the previous symbol $D_i$ according to the following XOR equations:

$D_{i+1}[7]=D_i[6]$ $D_{i+1}[6]=D_i[5]$ $D_{i+1}[5]=D_i[4]$ $D_{i+1}[4]=D_i[7]$ XOR $D_i[3]$ $D_{i+1}[3]=D_i[7]$ XOR $D_i[2]$ $D_{i+1}[2]=D_i[7]$ XOR $D_i[1]$ $D_{i+1}[1]=D_i[0]$ $D_{i+1}[0]=D_i[7]$

Since each successive symbol is equal to the product of the previous symbol and α, (i.e., $D_{i+1}=\alpha*D_i$) these equations can also be used to calculate the product of $\alpha^i$ X. Thus, a Galois Field multiplication of $\alpha^i$ X can be expressed using XOR logic. Accordingly, the following equations present examples of the logic to calculate various binary quantities $Y_i$, which are the product of $\alpha^i$ and X, for GF($2^8$).

Let X[7:0] be any symbol in GF($2^8$), and Y[7:0] be binary representation of the product of X times $\alpha^i$, Yi=$\alpha^i$X, i=1, 2, ..., 255. For example, if i=1, Y1=$\alpha^1$X=Y1[7]=X[6]

Y1[6]=X[5]

Y1[5]=X[4]

Y1[4]=X[7] XOR X[3]

Y1[3]=X[7] XOR X[2]

Y1[2]=X[7] XOR X[1]

Y1[1]=X[0]

Y1[0]=X[7]

If i=2, the equations for Y2 can be derived from the equations for Y1 using the above-defined relationship between $D_{i+1}$ and $D_i$.

Y2=$\alpha^1$X=Y2[7]=Y1[6]=X[5]

Y2[6]=Y1[5]=X[4]

Y2[5]=Y1[4]=X[7] XOR X[3]

Y2[4]=Y[7] XOR Y1[3]=X[6] XOR X[7] XOR X[2]

Y2[3]=Y1[7] XOR Y1[2]=X[6] XOR X[7] XOR X[1]

Y2[2]=Y1[7] XOR Y1[1]=X[6] XOR X[0]

Y2[1]=Y1[0]=X[7]

Y2[0]=Y1[7]=X[6]

The XOR equations for Y3-Y255 can similarly be derived (examples of which are provided below).

The above examples can be generalized to other Galois fields other than GF($2^8$). In particular, given knowledge of the relationship between successive symbols of a particular Galois field, XOR equations for calculating symbol $D_{i+1}$ in terms of symbol $D_i$ can be derived. These XOR equations can then be used to calculate the product of $\alpha^i$ X, for that particular Galois field, as shown above.

Reed Solomon Encoder

A Reed Solomon encoder operates on symbols of a Galois field GF($2^m$). As an example, consider a Reed Solomon encoder that implements the A Reed Solomon encoder implemented using the RS(255,239) algorithm operates on Galois Field GF($2^8$). The generator polynomial of the RS(255,239) code is given by:

$$g(x) = \prod_{i=0}^{i=15} (x - a^i),$$

where α is a root of the binary primitive polynomial p(x). This equation can be rewritten as:

$g(x)=g_0+g_1x+g_2x+ \ldots +g_{15}x^{15}+x^{16}$.

The Reed Solomon encoder creates a long polynomial, in which the number of coefficients equals the number of symbols in the code word. For RS(255, 239), the first 239 coefficients of this long polynomial equal the message bytes, and the last 16 coefficients equal the parity bytes. The long polynomial generated by the encoder is equal to the product of the generator polynomial g(x) and another polynomial q(x). Accordingly, the encoder calculates parity bytes r(x) according to the following equation:

$$\frac{x^{n-k}m(x)}{g(x)} = q(x) + \frac{r(x)}{g(x)},$$

where $x^{n-k}m(x)$ is the message byte.

Figure 3:
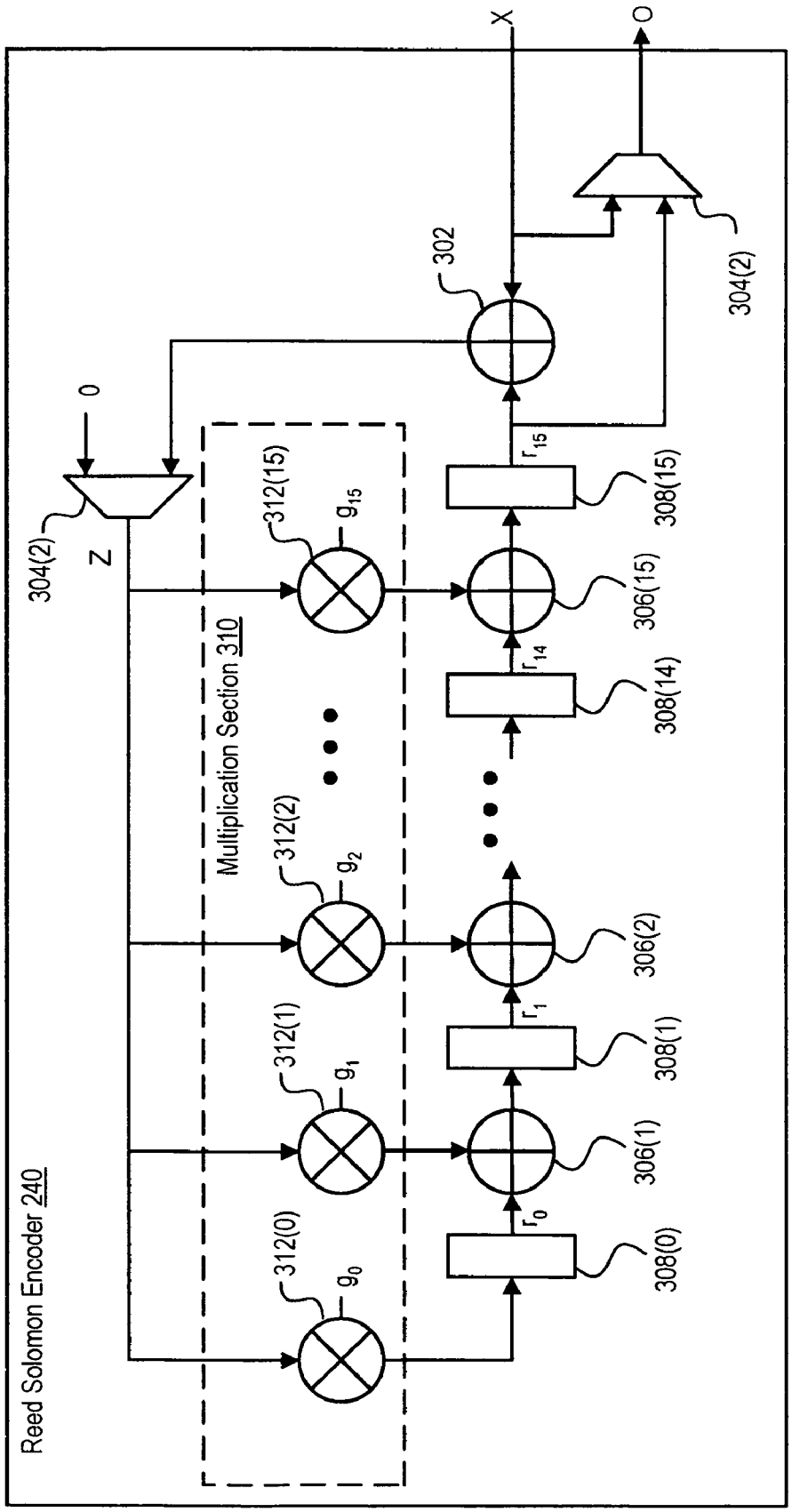
FIG. 3 illustrates a Reed Solomon encoder, according to one embodiment of the present invention.

When using the RS(255,239) algorithm to generate a Reed Solomon code word, each code word has 239 message bytes and 16 (i.e., 255−239=16) parity bytes. FIG. 3 illustrates a block diagram of a Reed Solomon encoder 240. 239 message bytes (X) are input serially to Reed Solomon encoder 240. Reed Solomon encoder 240 passes the 239 message bytes to the output (O). While the 239 message bytes are being passed to the output, Reed Solomon encoder 240 calculates the 16 parity bytes ($r_0$-$r_{15}$). Reed Solomon encoder 240 then sends out the parity bytes as the last 16 bytes of the codeword.

As shown in FIG. 3, an incoming message byte X (e.g., generated by a data source within the same network device as encoder 240) enters the encoder and is input to summation block 302 as well as to an input of multiplexer 304(1), which selects either a message byte or a parity byte for output as output byte O. For the first 239 bytes of the message, multiplexer 304(1) selects X, and for the final 16 bytes of the message, multiplexer 304(1) selects the parity byte.

Multiplexer 304(2) selects either a byte having value '00000000b' or the output of summation block 302 for input to multiplication section 310. The selected symbol, referred to in this example as Z, is provided to the input of multiplication section 310. Multiplication section 310 includes 2t (for RS(255, 239), 2t=16) different multiplication blocks 312(0)-312(15), each of which multiplies the incoming symbol byte Z by a respective constant $g_0$, $g_1$, $g_2$, ..., and $g_{15}$. The resulting products of the incoming byte Z and $g_1$, $g_2, \ldots$, and $g_{15}$ are then provided from the output of multiplication section 310 to respective summation blocks 306(1), 306(2), ..., 306(14). Summation blocks 306(1)-306(15) receive inputs from registers 308(0)-308(14). Parity bytes $r_0$-$r_{15}$ are respectively available at the outputs of registers 308(1)-308(15).

In the example of FIG. 3, multiplication section 310 of the Reed Solomon encoder is implemented using XOR-based logic. The XOR-based logic is primarily composed of XOR gates and the connections between the input, output, and XOR gates. The input, output, and XOR gates are coupled to each other such that multiplication section 310 receives a symbol (Z, in this example) at an input and outputs one or more products. Each product is the product of the symbol, received at the input of multiplication section 310, and a respective powers of $\alpha$. Multiplication section 310 is explained in more detail below.

The use of XOR-based logic differs from conventional implementations of Reed Solomon encoders, which typically use general purpose Galois field multipliers to implement the multiplication section. By using XOR-based logic, the amount of logic needed to implement multiplication section 310 can be significantly reduced, relative to the amount of logic required to implement equivalent general purpose Galois field multipliers. In turn, by reducing the amount of logic needed to implement multiplication section 310, Reed Solomon encoder 240 can be operated at a higher frequency.

Multiplication section 310 is used to calculate the products $g_i Z$, where Z is the output of multiplexer 304(2), for i=0, 1, ..., 15. For RS(255, 239), each symbol $g_i$ is equal to one of the symbols defined within $GF(2^8)$. For example, for i=0, $g_0 = \alpha^{120}$. Thus, the multiplication block 312(0) is configured to generate the product $\alpha^{120}Z$. The coefficients $g_i$, i=0, 1, ..., 15 of the polynomial g(x) are listed below:

$g_0 = \alpha^{120}$ $g_1 = \alpha^{225}$ $g_2 = \alpha^{194}$ $g_3 = \alpha^{182}$ $g_4 = \alpha^{169}$ $g_5 = \alpha^{147}$ $g_6 = \alpha^{191}$ $g_7 = \alpha^{91}$ $g_8 = \alpha^{3}$ $g_9 = \alpha^{76}$ $g_{10} = \alpha^{161}$ $g_{11} = \alpha^{102}$ $g_{12} = \alpha^{109}$ $g_{13} = \alpha^{107}$ $g_{14} = \alpha^{104}$ $g_{15} = \alpha^{120}$ For $GF(2^m)$, each $\alpha^i$, where i>m-1, can be expressed as a sum of selected ones of $\alpha^0, \alpha^1, \alpha^2, \ldots, \alpha^{m-1}$. For example, in $GF(2^8)$, the binary representation of symbol $\alpha^{120}$ is 11011100. Thus, $\alpha^{120}$ can be expressed in polynomial format as:

$$\alpha^{120} = 1*\alpha^0 + 1*\alpha^1 + 0*\alpha^2 + 1*\alpha^3 + 1*\alpha^4 + 1*\alpha 5 + 0*\alpha^6 + 0*\alpha^7$$
$$= 1 + \alpha + \alpha^3 + \alpha^4 + \alpha^5.$$

Accordingly, $g_0 Z = \alpha^{120} Z = Z + \alpha Z + \alpha^3 Z + \alpha^4 Z + \alpha^5 Z.$ Since any $\alpha^i$, i>m-1 can be expressed as the linear sum of one or more of $\alpha^j Z$, j=1, 2, ..., m-1, and since XOR expressions can be derived for each $\alpha^j Z$, j=1, 2, ..., m-1, the XOR expressions for each $\alpha^j Z$ can be summed to generate the expression for $\alpha^i Z$, where i>m-1. For example, to calculate $\alpha^{120} Z$ for $GF(2^8)$, the individual equations shown above for Z, $\alpha Z$, $\alpha^3 Z$, $\alpha^4 Z$, and $\alpha^5 Z$ are summed. Since Galois field addition for $GF(2^m)$ is implemented using modulo-two addition, this sum can be calculated using XOR-based logic (i.e., the modulo-two sum of A and B is equal to A XOR B).

To show how the XOR equations for the product (Y120) of $\alpha^{120} Z$ can be derived, the XOR equations for the terms Z, $\alpha Z$, $\alpha^3 Z$, $\alpha^4 Z$, and $\alpha^5 Z$ are presented below.

XOR equations for Y0=Z=Z:

Y0[7]=Z[7]

Y0[6]=Z[6]

Y0[5]=Z[5]

Y0[4]=Z[4]

Y0[3]=Z[3]

Y0[2]=Z[2]

Y0[1]=Z[1]

Y0[0]=Z[0]

XOR equations for Y1=$\alpha Z$

Y1[7]=Z[6]

Y1[6]=Z[5]

Y1[5]=Z[4]

Y1[4]=Z[7] XOR Z[3]

Y1[3]=Z[7] XOR Z[2]

Y1[2]=Z[7] XOR Z[1]

Y1[1]=Z[0]

Y1[0]=Z[7]

XOR equations for Y3=$\alpha^3 Z$

Y3[7]=Z[4]

Y3[6]=Z[7] XOR Z[3]

Y3[5]=Z[6] XOR Z[7] XOR Z[2]

Y3[4]=Z[5] XOR Z[6] XOR Z[7] XOR Z[1]

Y3[3]=Z[5] XOR Z[6] XOR Z[0]

Y3[2]=Z[5] XOR Z[7]

Y3[1]=Z[6]

Y3[0]=Z[5]

XOR equations for $Y4=\alpha^4 Z$

Y4[7]=Z[7] XOR Z[3]

Y4[6]=Z[6] XOR Z[7] XOR Z[2]

Y4[5]=Z[5] XOR Z[6] XOR Z[7] XOR Z[1]

Y4[4]=Z[4] XOR Z[5] XOR Z[6] XOR Z[0]

Y4[3]=Z[4] XOR Z[5] XOR Z[7]

Y4[2]=Z[4] XOR Z[6]

Y4[1]=Z[5]

Y4[0]=Z[4]

XOR equations for $Y5=\alpha^5 Z$

Y5[7]=Z[6] XOR Z[7] XOR Z[2]

Y5[6]=Z[5] XOR Z[6] XOR Z[7] XOR Z[1]

Y5[5]=Z[4] XOR Z[5] XOR Z[6] XOR Z[0]

Y5[4]=Z[3] XOR Z[4] XOR Z[5]

Y5[3]=Z[7] XOR Z[3] XOR Z[4] XOR Z[6]

Y5[2]=Z[7] XOR Z[3] XOR Z[5]

Y5[1]=Z[4]

Y5[0]=Z[7] XOR Z[3]

By combining the above equations, for each Y120[i], i=0, 1, . . . , 7, the resulting equation is Y120[i]=Y0[i] XOR Y1[i] XOR Y3[i] XOR Y4[i] XOR Y5[i]. Thus, the following XOR equation is used to calculate Y120[7]:

$$Y120[7] = \{Z[7](\text{expression for } \alpha^0 Z)\} XOR$$
$$\{Z[6](\text{expression for } \alpha^1 Z)\} XOR$$
$$\{Z[4](\text{expression for } \alpha^3 Z)\} XOR$$
$$\{Z[7] XOR Z[3](\text{expression for } \alpha^4 Z)\} XOR$$
$$\{Z[6] XOR Z[7] XOR Z[2](\text{expression for } \alpha^5 Z)\}$$
$$= Z[7] XOR Z[6] XOR Z[4] XOR Z[7] XOR Z[3] XOR Z[6] XOR Z[7] XOR Z[2]$$
$$= Z[4] XOR Z[3] XOR Z[7] XOR Z[2].$$

The equations for Y120[6:0] can be similarly derived:

Y120[6]=Z[3] XOR Z[2] XOR Z[6] XOR Z[7] XOR Z[1]

Y120[5]=Z[2] XOR Z[1] XOR Z[5] XOR Z[6] XOR Z[0]

Y120[4]=Z[1] XOR Z[0] XOR Z[4] XOR Z[5]

Y120[3]=Z[2] XOR Z[0] XOR Z[7]

Y120[2]=Z[2] XOR Z[1] XOR Z[4] XOR Z[6] XOR Z[7] XOR Z[3]

Y120[1]=Z[1] XOR Z[0] XOR Z[6] XOR Z[5] XOR Z[4]

Y120[0]=Z[0] XOR Z[5] XOR Z[4] XOR Z[3]

The portion of the multiplication section shown in FIG. 3 that multiplies Z by $g_0$ includes the XOR-based logic needed to implement the equations for Y120[7:0]. Similarly, the other portions of the multiplication section shown in FIG. 3 include the XOR-based logic needed to implement the equations for $g_1 Z$, $g_2 Z$, . . . , $g_{15} Z$. These equations can be derived in the same manner as the equations for $g_0 Z$ above. The equations used to generate $g_1 Z$, $g_2 Z$, . . . , $g_{15} Z$ are included below.

While the above example shows how the XOR equations for Y120[7:0] can be derived from equations for Y0-Y7, it is noted that the equations can also be derived by using the relationship between Di and Di+1 to identify equations for Y0-Y119, and then generating the equations for Y120 based on the equations for Y119. Additionally, in the above example, the equations for Y120 are simplified (e.g., expressions, such as X[7] XOR X[7], are removed from the equations, since X XOR X=0 and 0 XOR Y=Y). It is noted that in some alternative embodiments, the equations may be implemented in a non-reduced form or in a form that has been somewhat, but not fully, simplified.

While the example described above is specific to RS(255, 239), the same principles can be used to implement multiplication sections for use in Reed Solomon encoders used with codes other than RS(255, 239). For example, similar techniques can be used to generate XOR equations for other codes RS(255, k).

In general, for RS(n, k), such a multiplication section includes XOR-based logic (e.g., one or more XOR gates) that receives m bits of message data and that generates 2t m-bit products, where each of the 2t products is the product of Z (the m bits of input symbol data) and a respective $g_i$, i=0, 1, . . . , 2t-1. The XOR-based logic calculates the product of a symbol and $g_i$ as the linear sum of products of a symbol and one or more powers of $\alpha$. The symbol is the only input necessary to calculate the product of the symbol and a power of $\alpha$, using the XOR-based logic.

FIG. 3 is provided as an example and shows a Reed Solomon multiplication section implemented from XOR-based logic in the context of a particular encoder. It is noted that other embodiments can use different encoder configurations while still employing Reed Solomon multiplication sections implemented using XOR-based logic according to the present invention.

The Reed Solomon multiplication section of FIG. 3 is implemented using XOR-based logic instead of conventional Galois field multipliers. It is noted that in other embodiments, Reed Solomon multiplication sections are implemented using XOR-based logic as well as conventional Galois field multipliers and/or other non-XOR-based multiplication devices. For example, a hybrid Reed Solomon multiplication section can include a multiplier implemented using XOR-based logic as well as a conventional Galois field multiplier. Each multiplier within the hybrid Reed Solomon multiplication section calculates the product of X and a power of $\alpha$.

Reed Solomon Syndrome Generator

Use of the techniques described above allows the multiplication section of a Reed Solomon encoder to be implemented using XOR-based logic. Similarly techniques can be used to implement the multiplication section of a syndrome generator, used within a Reed Solomon decoder, using XOR-based logic (or a combination of XOR-based logic, conventional Galois field multipliers, and/or other multiplication devices as described above).

A syndrome, s(x), of a code word is the remainder of the division of the received word r(x) by the generator polynomial, as implied by the following equation:

$$\frac{r(x)}{g(x)} = q(x) + \frac{s(x)}{g(x)}$$

$$\frac{r(x)}{(x-a^i)} = q(x) + \frac{s_i}{(x-a^i)}$$

$$s_i = r(\alpha^i)$$
$$= r_0 + r_1\alpha^i + \ldots + r_{254}\alpha^{254i}$$
$$= r_0 + \alpha^i(r_1 + \alpha^i(\ldots + \alpha^i(r_{253} + \alpha^i r_{254})\ldots)),$$

for i=1, 2, . . . , 15. For example, if i=10, $$s_{10} = r(\alpha^{10})$$
$$= r_0 + r_1\alpha^{10} + \ldots + r_{254}\alpha^{254 \times 10}$$
$$= r_0 + \alpha^{10}(r_1 + \alpha^{10}(\ldots + \alpha^{10}(r_{253} + \alpha^{10}r_{254})\ldots)).$$

As shown by the above equations, the syndrome calculation for $s_i$ can be expressed as the sum of products of selected $\alpha^i$ and $r_j$, for j=0, 1, . . . , n−1 (n is the number of symbols in a code word). Furthermore, as noted above in the discussion of the Reed Solomon encoder, for a GF($2^m$), powers of α greater than m−1 can be expressed as the linear sum of powers of α that are less than or equal to m−1. For example, $\alpha^{10} = \alpha^2 + \alpha^4 + \alpha^5 + \alpha^6$, and thus $\alpha^{10} r_j = \alpha^2 r_j + \alpha^4 r_j + \alpha^5 r_j + \alpha^6 r_j$. Accordingly, the syndrome calculation for $s_i$ can be expressed as the sum of products of selected $\alpha^i$ and $r_j$, j=0, 1, . . . , 254, and i<m−1. For example, if i=10, the syndrome $s_{10}$ can be calculated as follows:

$$s_{10}=r_0+(\alpha^2+\alpha^4+\alpha^5+\alpha^6)(r_1+(\alpha^2+\alpha^4+\alpha^5+\alpha^6)(\ldots+(\alpha^2+\alpha^4+\alpha^5+\alpha^6)(r_{253}+\alpha^2 r_{254}+\alpha^4 r_{254}+\alpha^5 r_{254}+\alpha^6 r_{254})\ldots).$$

Since each of the sums and products shown in the above equation can be generated using XOR-based logic, $s_{10}$ can be generated using XOR-based logic. Similarly, the other syndromes can also be generated using XOR-based logic.

Figure 4:
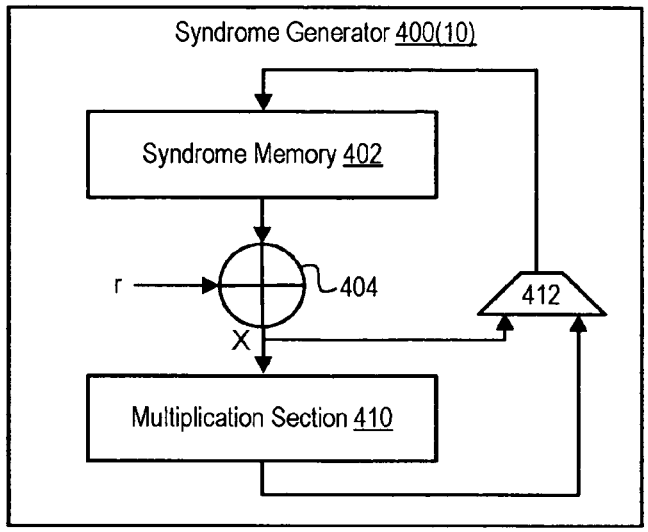
FIG. 4 is a block diagram of a Reed Solomon syndrome generator, according to one embodiment of the present invention.

FIG. 4 shows an example of a syndrome generator 400 (10) that is configured to generate the tenth syndrome, $s_{10}$, for RS(255, 239). As shown, syndrome generator 400(10) includes syndrome memory 402, addition logic 404 (for generating the sum of the quantity in syndrome memory 402 and the received data r), multiplication section 410, and multiplexer 412 for selecting between the output of addition logic 404 and the output of multiplication section 410.

Multiplication section 410 of the syndrome generator 400(10) includes XOR-based logic for generating the product of a respective power of α and the quantity X output from the addition logic. Since this syndrome generator 400(10) is used to generate s10, multiplication section 410 includes XOR-based logic that is configured to generate the product of $\alpha^{10} X = \alpha^2 X + \alpha^4 X + \alpha^5 X + \alpha^6 X$. The XOR-based equations for Y10[7:0] (Y10=$\alpha^{10}$ X) implemented by multiplication section 410 are shown below. These equations for Y10[7:0] are derived in the same way as the equations for Y120[7:0] discussed above.

Y10[7]=X[7] XOR X[1] XOR X[2] XOR X[3]

Y10[6]=X[6] XOR X[0] XOR X[1] XOR X[2]

Y10[5]=X[5] XOR X[0] XOR X[1]

Y10[4]=X[4] XOR X[0] XOR X[7]

Y10[3]=X[2] XOR X[6] XOR X[7] XOR X[1]

Y10[2]=X[2] XOR X[3] XOR X[5] XOR X[6] XOR X[0]

Y10[1]=X[3] XOR X[4] XOR X[5]

Y10[0]=X[2] XOR X[3] XOR X[4]

Figure 5:
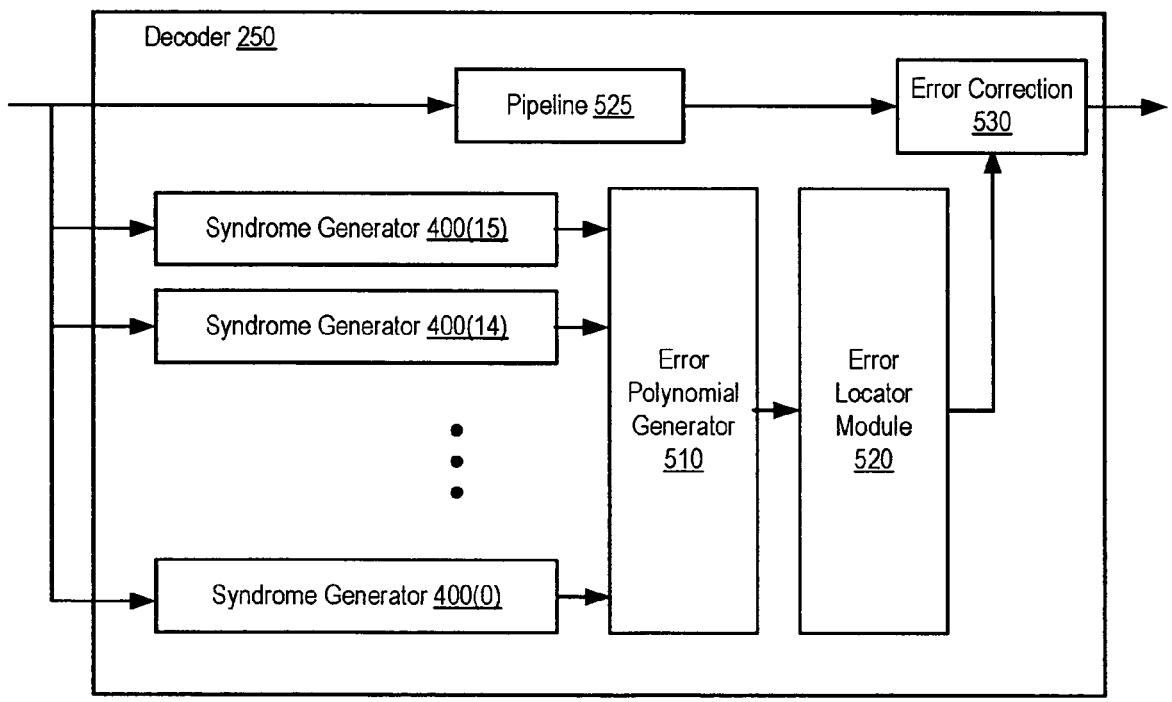
FIG. 5 is a block diagram of a Reed Solomon decoder, according to one embodiment of the present invention.

FIG. 5 illustrates how a RS(255, 239) decoder 250 can include one syndrome generator to generate each syndrome, $s_0$-$s_{15}$. Decoder 250 includes syndrome generators 400(0)-400(15), error polynomial generator 510, error locator and error value calculation module 520, pipeline 525, and error correction module 530.

Incoming symbols are input to pipeline 525 and to each of syndrome generators 400(0)-400(15). Syndrome generators 400(0)-400(15) respectively generate syndromes $s_0$-$s_{15}$ (i.e., syndrome generator 400(0) generates syndrome $s_0$, syndrome generator 400(1) generates syndrome $s_1$, and so on). Each syndrome generator 400(0)-400(15) can operate in parallel in order to simultaneously generate the syndromes $s_0$-$s_{15}$. Each syndrome generator 400(0)-400(15) includes a multiplication section that, like multiplication section 410 of FIG. 4, is implemented from XOR-based logic.

The syndrome generated by each syndrome generator 400(0)-400(15) based on the received symbol is input to error polynomial generator 510. Error polynomial generator 510 generates an error polynomial, based on the syndromes. The error polynomial is then input to error locator module 520, which identifies the positions of any errors within the received symbols. Information identifying those positions is provided to error correction module 530, which corrects the identified bit(s), if any, in the incoming symbols (e.g., if the value of an identified bit is a logical 0, the value is changed to logical 1, or vice versa).

Pipeline 525 delays the input symbol so that the input symbol is provided to error correction module 530 at the same time (e.g., during the same clock cycle) as the error location information for that symbol is provided to error correction module 530, allowing the appropriate correction to be applied to the symbol.

Additional Embodiments

Figure 6:
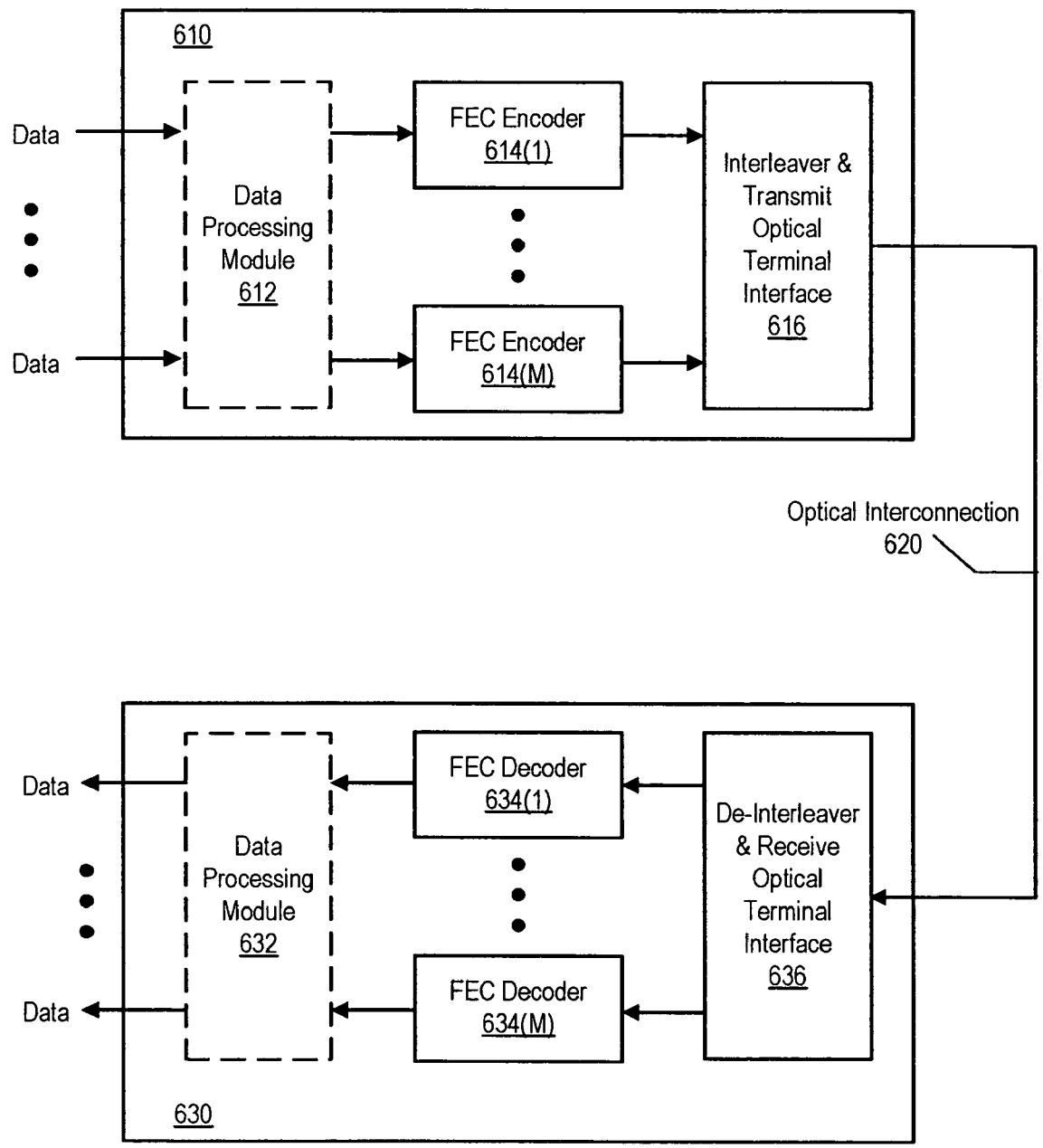
FIG. 6 is a block diagram of an ITU-T G.709 data communication system that includes XOR-based logic multiplication sections in both Reed Solomon encoders and decoders, according to one embodiment of the present invention.

FIG. 6 illustrates an example of an optical transport networking system that complies with ITU-T G.709. The International Telecommunications Union (ITU) selected the Reed-Solomon (RS)(255,239) algorithm to perform forward error correction in optical transport networks, as described in standards ITU-T G.709 and ITU-T G.975. The system shown in FIG. 6 can employ Reed Solomon multiplication sections, which are implemented using XOR-based logic according to the above-described techniques, in the RS(255, 239) encoders and/or decoders.

In FIG. 6, transmit terminal transmission equipment (TTE) 610 is coupled, by optical interconnection 620, to receive TTE 630. As shown, transmit TTE 610 receives M input signals (these input signals can be received from a data source external to transmit TTE 610 or from a data source internal to transmit TTE 610). The M input signals are input to data processing module 612, which processes the incoming data (it is noted that data processing module 612 is optional, as indicated by the dashed lines, and may not be included in some embodiments). For example, in one embodiment, the input signals are optical signals (e.g., STM-16 signals) and data processing module 612 includes a device that converts the optical signals into corresponding electrical signals.

FEC encoders 614(1)-614(M) encode the electrical signals by adding redundant information according to RS(255, 239). FEC encoders 614(1)-614(M) include Reed Solomon multiplication sections that are implemented using XOR-based logic, as described above, instead of general purpose GF multipliers.

FEC encoders 614(1)-614(M) provide the encoded signals to interleaver and transmit optical terminal interface 616. Interleaver and transmit optical terminal interface 616 interleaves the individual encoded electrical signals received from FEC encoders 614(1)-614(M), converts the interleaved electrical signal into an optical signal, and outputs the optical signal via optical interconnection 620.

De-interleaver and receive optical terminal interface 636 receives the optical signal, which may have been corrupted due to noise on optical interconnection 620. De-interleaver and receive optical terminal interface 636 converts the received optical signal into an electrical signal and de-interleaves the electrical signal into M individual electrical signals.

De-interleaver and receive optical terminal interface 636 outputs the M electrical signals to respective FEC decoders 634(1)-634(M). Each FEC decoder 634(1)-634(M) receives one of the electrical signals and decodes that electrical signal according to RS(255, 239). Thus, each FEC decoder 634(1)-634(M) uses the redundant information (generated by one of FEC encoders 614(1)-614(M)) to verify and/or correct the data included in the electrical signal. Each FEC decoder 634(1)-634(M) includes a Reed Solomon multiplication section that is implemented using XOR-based logic, as described above.

FEC decoders 634(1)-634(M) each output a respective, non-encoded electrical signal to data processing module 632. Data processing module 632 is optional, as indicated by the dashed lines. Data processing module 632 can process the decoded electrical signals and/or provide the signals to a data sink internal and/or external to receive TTE 630. In one embodiment, data processing module 632 includes one or more optical transmitters that convert the electrical signals into optical signals (e.g., optical STM-16 signals) for transmission to another device.

It is noted that, due to the use of XOR-based logic to implement the multiplication sections in FEC encoders 614(1)-614(M) and FEC decoders 634(1)-634(M), the amount of logic required to implement each FEC encoder and decoder is reduced. Since multiple encoders and/or decoders are required in each TTE, reducing the amount of logic required for each encoder and/or decoder can significantly reduce the amount of logic required to implement each TTE.

Generating XOR Equations for a Reed Solomon Multiplication Section

Figure 7:
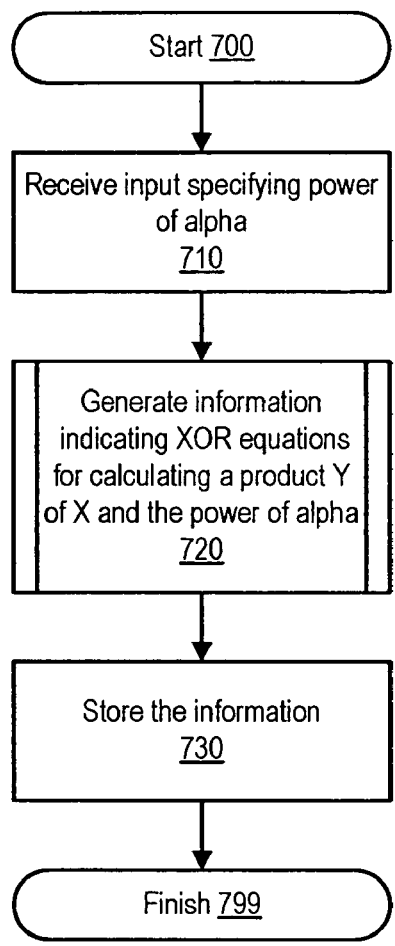
FIG. 7 illustrates a method of automatically generating information that indicates XOR equations for a Reed Solomon multiplication section, according to one embodiment of the present invention.

FIG. 7 is a flowchart of a method of automatically generating the XOR equations used to implement a Reed Solomon multiplication section for use in a Reed Solomon encoder. The XOR equations generated by such a method can be used to generate a hardware description of a Reed Solomon encoder.

The method begins at 700. At 710, input specifying a power of α is received. This indicates that equations for generating a product Y of X and that power of α are desired. The input can be received from a process (e.g., a software process for generating a hardware description of a Reed Solomon multiplication section) or directly from a user.

Each power of α represents a symbol that exists within a Galois field $GF(2^m)$. Y and X are symbols that each include m bits, and α is a root of a primitive polynomial associated with a particular Reed Solomon code (i.e., the primitive polynomial p(x) used to generate symbols within $GF(2^m)$).

At 720, information indicating XOR equations for calculating the product Y of X and the power of α is generated. The number of equations equals m, and each equation corresponds to a respective bit within Y. Thus, equations for Y[0]–Y[m–1] are generated.

The information generated at 720 can include the equations themselves (or information representing those equations) or information that indicates which bits within symbol X should be included in each equation. For example, if one of the equations is Y[7]=X[7] XOR X[1] XOR X[2] XOR X[3], the information that indicates that equation can include 7 7 1 2 3. The first number, 7, corresponds to the bit within Y. The other numbers identify the bits within X to be XORed in order to generate Y[7].

It is noted that some equations may simply indicate that a particular bit within Y equals a particular bit within X (e.g., Y[6]=X[5]). Such equations can also be implemented using XOR-based logic (e.g., by simply connecting the X[5] input of the XOR-based logic to the Y[6] output of the XOR-based logic).

The relationship between symbols $D_{i+1}$ and $D_i$ in the Galois field $GF(2^m)$ is defined by XOR equations, as described above. These XOR equations are also the XOR equations for calculating the product of X and $\alpha^1$. These equations are used to generate the XOR equations for calculating the product of X and $\alpha^i$.

The equations can be generated in several ways. In one embodiment, the equations are generated by applying the equations that define $D_{i+1}$ a number of times equal to the power of α specified at 710. For example, if the specified power of α is 20, the XOR equations for calculating Y as the product of X and $\alpha^{20}$ are calculated as follows. First, the XOR equations for calculating Z1 as the product X and α (i.e., the equations that define the relationship between successive symbols in $GF(2^m)$ are obtained. Then, the XOR equations for calculating Z2 as the product of Z1 and α are obtained by plugging the XOR equations for Z1 into the XOR equations that define the relationship between successive symbols. This process repeats for successive Zn until the XOR equations for calculating Y as the product of Z19 and α are obtained. These equations are the equations for calculating Y as the product of X and $\alpha^{20}$. In alternative embodiments, the equations for calculating Y are generated as described with respect to FIG. 8.

The information generated at 720 is then stored, as indicated at 730. Storing the information can involve writing the information to volatile memory (e.g., RAM) or writing the information to a non-volatile memory. The information can also be displayed to a user (not shown) or transferred via a network. The method ends at 799.

In one embodiment, the method of FIG. 7 can be implemented by a process within a hardware design tool. For example, another process can build a description of a Reed Solomon multiplication section for an encoder or decoder by calling the process illustrated in FIG. 7 each time that XOR equations for generating the product of X and a particular power of α are needed.

Figure 8:
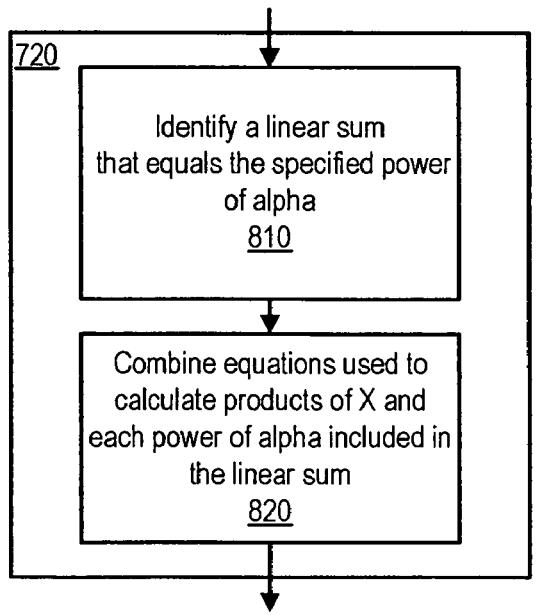
FIG. 8 illustrates a method of generating XOR equations, according to one embodiment of the present invention.

FIG. 8 illustrates an example of how function 720 of FIG. 7 can be performed. In this example, the XOR equations for calculating the product Y of X and a specified power of α are calculated by first identifying a linear sum that equals the specified power of α, as shown at 810. The linear sum is a sum of one or more $\alpha^i$, where $0<=i<=m-1$, and m is the number of bits in each symbol X and Y.

Identifying the linear sum can be performed by accessing a table that lists the binary representation of each power α of within a particular Galois field. For example, if the Galois field is $GF(2^8)$, the binary representation of $\alpha^{120}$ is 11011100. Each bit within the binary representation corresponds to a particular $\alpha^i$. Based on the binary representation, $\alpha^{120}$ can be expressed in polynomial format as:

$$\alpha^{120} = 1*\alpha^0 + 1*\alpha^1 + 0*\alpha^2 + 1*\alpha^3 + 1*\alpha^4 + 1*\alpha5 + 0*\alpha^6 + 0*\alpha^7$$
$$= 1 + \alpha + \alpha^3 + \alpha^4 + \alpha^5.$$

Thus, the linear sum for $\alpha^{120}$ can be identified as $1+\alpha+\alpha^3+\alpha^4\alpha^5$.

The XOR equations used to calculate products of X and each $\alpha^i$ included in the linear sum are then combined, as shown at 820. Combining these equations yields the equations for the product of X and the specified power of α. For example, for $\alpha^{120}$, the XOR equations used to calculate $X*\alpha^0$, $X*\alpha^1$, $X*\alpha^3$, $X*\alpha^4$, and $X*\alpha^5$ are combined, as described above.

It is noted that the program instructions and/or data for implementing a Reed Solomon multiplication section from XOR-based logic can be stored on various computer readable media such as a memory (e.g., RAM (Random Access Memory)). For example, a hardware description language (HDL) description or logic synthesis tool definition of such a multiplication section can be stored on a computer readable medium. Similarly, program instructions and or data for implementing the methods of FIGS. 7 and/or 8 can be stored on computer readable media.

In some embodiments, such data and/or instructions are stored on a computer readable medium such as a CD (Compact Disc), DVD (Digital Versatile Disc), hard disk, optical disk, tape device, floppy disk, and the like). In order be executed, the instructions and/or data is loaded into memory from another computer readable medium. The instructions and/or data can also be transferred to a computing device for storage in memory via a network such as the Internet or upon a carrier medium. In some embodiments, a computer readable medium is a carrier medium such as a network and/or a wireless link upon which signals such as electrical, electromagnetic, or digital signals, on which the data and/or instructions are conveyed.

Additional Equations for RS(255, 239) Multiplication Sections

Equations used in the multiplication section of an RS(255, 239) encoder are provided below. These equations are used to generate the products of an incoming byte X (X is the input to the multiplication section) and respective constants $g_0, g_1, \ldots, g_{15}$.

The portion of the multiplication section that calculates $g_0X$ and $g_{15}X$ calculates the product $\alpha^{120}X=Y120$.

Y120[7]=X[4] XOR X[3] XOR X[7] XOR X[2]

Y120[6]=X[3] XOR X[2] XOR X[6] XOR X[7] XOR X[1]

Y120[5]=X[2] XOR X[1] XOR X[5] XOR X[6] XOR X[0]

Y120[4]=X[1] XOR X[0] XOR X[4] XOR X[5]

Y120[3]=X[2] XOR X[0] XOR X[7]

Y120[2]=X[2] XOR X[1] XOR X[4] XOR X[6] XOR X[7] XOR X[3]

Y120[1]=X[1] XOR X[0] XOR X[6] XOR X[5] XOR X[4]

Y120[0]=X[0] XOR X[5] XOR X[4] XOR X[3]

The portion of the multiplication section that calculates $g_1X$ calculates the product $\alpha^{225}X=Y225$.

Y225[7]=X[5] XOR X[6] XOR X[7] XOR X[2]

Y225[6]=X[4] XOR X[5] XOR X[6] XOR X[7] XOR X[1]

Y225[5]=X[7] XOR X[3] XOR X[4] XOR X[5] XOR X[6] XOR X[0]

Y225[4]=X[6] XOR X[7] XOR X[2] XOR X[3] XOR X[4] XOR X[5]

Y225[3]=X[1] XOR X[3] XOR X[4]

Y225[2]=X[6] XOR X[0] XOR X[7] XOR X[3] XOR X[5]

Y225[1]=X[7] XOR X[4]

Y225[0]=X[6] XOR X[7] XOR X[3]

The portion of the multiplication section that calculates $g_2X$ calculates the product $\alpha^{194}X=Y194$.

Y194[7]=X[3] XOR X[2]

Y194[6]=X[2] XOR X[1]

Y194[5]=X[7] XOR X[1] XOR X[0]

Y194[4]=X[7] XOR X[6] XOR X[0]

Y194[3]=X[2] XOR X[5] XOR X[7] XOR X[3] XOR X[6]

Y194[2]=X[1] XOR X[4] XOR X[6] XOR X[3] XOR X[5]

Y194[1]=X[0] XOR X[5] XOR X[4]

Y194[0]=X[4] XOR X[3]

The portion of the multiplication section that calculates $g_3X$ calculates the product $\alpha^{182}X=Y182$.

Y182[7]=X[2] XOR X[5] XOR X[6] XOR X[1]

Y182[6]=X[7] XOR X[1] XOR X[4] XOR X[5] XOR X[0]

Y182[5]=X[6] XOR X[0] XOR X[3] XOR X[4]

Y182[4]=X[7] XOR X[5] XOR X[2] XOR X[3]

Y182[3]=X[4] XOR X[5]

Y182[2]=X[1] XOR X[3] XOR X[5] XOR X[6] XOR X[7] XOR X[2] XOR X[4]

Y182[1]=X[0] XOR X[4] XOR X[7] XOR X[3]

Y182[0]=X[3] XOR X[6] XOR X[7] XOR X[2]

The portion of the multiplication section that calculates $g_4X$ calculates the product $\alpha^{169}X=Y169$.

Y169[7]=X[2] XOR X[7] XOR X[1] XOR X[4] XOR X[5] XOR X[6] XOR X[0]

Y169[6]=X[7] XOR X[1] XOR X[6] XOR X[0] XOR X[3] XOR X[4] XOR X[5]

Y169[5]=X[7] XOR X[6] XOR X[0] XOR X[5] XOR X[2] XOR X[3] XOR X[4]

Y169[4]=X[6] XOR X[5] XOR X[4] XOR X[1] XOR X[2] XOR X[3]

Y169[3]=X[6] XOR X[3]

Y169[2]=X[0] XOR X[4] XOR X[6] XOR X[1]

Y169[1]=X[1] XOR X[4] XOR X[3] XOR X[6] XOR X[7] XOR X[2]

Y169[0]=X[0] XOR X[3] XOR X[2] XOR X[5] XOR X[6] XOR X[7] XOR X[1]

The portion of the multiplication section that calculates $g_5X$ calculates the product $\alpha^{147}X=Y147$.

Y147[7]=X[4] XOR X[6] XOR X[2]

Y147[6]=X[3] XOR X[5] XOR X[1]

Y147[5]=X[7] XOR X[2] XOR X[4] XOR X[0]

Y147[4]=X[6] XOR X[7] XOR X[1] XOR X[3]

Y147[3]=X[5] XOR X[0] XOR X[7] XOR X[4]

Y147[2]=X[2] XOR X[3]

Y147[1]=X[1] XOR X[6] XOR X[4]

Y147[0]=X[0] XOR X[5] XOR X[7] XOR X[3]

The portion of the multiplication section that calculates $g_6X$ calculates the product $\alpha^{191}X=Y191$.

Y191[7]=X[5] XOR X[6] XOR X[1]

Y191[6]=X[4] XOR X[5] XOR X[0]

Y191[5]=X[3] XOR X[4]

Y191[4]=X[2] XOR X[3]

Y191[3]=X[6] XOR X[2] XOR X[5]

Y191[2]=X[6] XOR X[7] XOR X[4]

Y191[1]=X[1] XOR X[7] XOR X[3]

Y191[0]=X[0] XOR X[6] XOR X[7] XOR X[2]

The portion of the multiplication section that calculates $g_7X$ calculates the product $\alpha^{91}X=Y91$.

Y91[7]=X[2] XOR X[4] XOR X[5] XOR X[6] XOR X[0]

Y91[6]=X[7] XOR X[1] XOR X[3] XOR X[4] XOR X[5]

Y91[5]=X[6] XOR X[0] XOR X[2] XOR X[3] XOR X[4]

Y91[4]=X[5] XOR X[1] XOR X[2] XOR X[3]

Y91[3]=X[6] XOR X[5] XOR X[1]

Y91[2]=X[2] XOR X[6]

Y91[1]=X[1] XOR X[0] XOR X[4] XOR X[6] XOR X[7] XOR X[2]

Y91[0]=X[0] XOR X[3] XOR X[5] XOR X[6] XOR X[7] XOR X[1]

The portion of the multiplication section that calculates $g_8X$ calculates the product $\alpha^3X=Y3$.

Y3[7]=X[4]

Y3[6]=X[7] XOR X[3]

Y3[5]=X[6] XOR X[7] XOR X[2]

Y3[4]=X[5] XOR X[6] XOR X[7] XOR X[1]

Y3[3]=X[5] XOR X[6] XOR X[0]

Y3[2]=X[5] XOR X[7]

Y3[1]=X[6]

Y3[0]=X[5]

The portion of the multiplication section that calculates $g_9X$ calculates the product $\alpha^{76}X=Y76$.

Y76[7]=X[6] XOR X[5] XOR X[4] XOR X[7] XOR X[3]

Y76[6]=X[5] XOR X[4] XOR X[3] XOR X[6] XOR X[2]

Y76[5]=X[4] XOR X[3] XOR X[2] XOR X[5] XOR X[7] XOR X[1]

Y76[4]=X[3] XOR X[2] XOR X[7] XOR X[1] XOR X[4] XOR X[6] XOR X[0]

Y76[3]=X[2] XOR X[1] XOR X[0] XOR X[4] XOR X[7]

Y76[2]=X[1] XOR X[0] XOR X[5] XOR X[4]

Y76[1]=X[0] XOR X[7] XOR X[6] XOR X[5]

Y76[0]=X[7] XOR X[6] XOR X[5] XOR X[4]

The portion of the multiplication section that calculates $g_{10}X$ calculates the product $\alpha^{161}X=Y161$.

Y161[7]=X[3] XOR X[7] XOR X[1] XOR X[4] XOR X[0]

Y161[6]=X[7] XOR X[2] XOR X[6] XOR X[0] XOR X[3]

Y161[5]=X[6] XOR X[7] XOR X[1] XOR X[5] XOR X[2]

Y161[4]=X[5] XOR X[6] XOR X[0] XOR X[4] XOR X[7] XOR X[1]

Y161[3]=X[7] XOR X[6] XOR X[5] XOR X[1]

Y161[2]=X[7] XOR X[5] XOR X[6] XOR X[1] XOR X[3]

Y161[1]=X[1] XOR X[5] XOR X[3] XOR X[6] XOR X[2]

Y161[0]=X[0] XOR X[4] XOR X[2] XOR X[5] XOR X[1]

The portion of the multiplication section that calculates $g_{11}X$ calculates the product $\alpha^{102}X=Y102$.

Y102[7]=X[6] XOR X[7] XOR X[1]

Y102[6]=X[5] XOR X[6] XOR X[0]

Y102[5]=X[7] XOR X[4] XOR X[5]

Y102[4]=X[6] XOR X[7] XOR X[3] XOR X[4]

Y102[3]=X[7] XOR X[1] XOR X[2] XOR X[3] XOR X[5]

Y102[2]=X[0] XOR X[7] XOR X[2] XOR X[4]

Y102[1]=X[3]

Y102[0]=X[7] XOR X[2]

The portion of the multiplication section that calculates $g_{12}X$ calculates the product $\alpha^{109}X=Y109$.

Y109[7]=X[7] XOR X[3] XOR X[2] XOR X[0]

Y109[6]=X[2] XOR X[6] XOR X[7] XOR X[1]

Y109[5]=X[7] XOR X[1] XOR X[5] XOR X[6] XOR X[0]

Y109[4]=X[6] XOR X[0] XOR X[4] XOR X[5] XOR X[7]

Y109[3]=X[0] XOR X[7] XOR X[6] XOR X[5] XOR X[2] XOR X[4]

Y109[2]=X[2] XOR X[0] XOR X[4] XOR X[5] XOR X[6] XOR X[1]

Y109[1]=X[1] XOR X[5] XOR X[4] XOR X[2]

Y109[0]=X[0] XOR X[4] XOR X[3] XOR X[1]

The portion of the multiplication section that calculates $g_{13}X$ calculates the product $\alpha^{107}X=Y107$.

Y107[7]=X[4] XOR X[2] XOR X[5] XOR X[1]

Y107[6]=X[3] XOR X[1] XOR X[4] XOR X[0]

Y107[5]=X[7] XOR X[2] XOR X[0] XOR X[3]

Y107[4]=X[6] XOR X[7] XOR X[1] XOR X[2]

Y107[3]=X[0] XOR X[7] XOR X[4] XOR X[6] XOR X[2]

Y107[2]=X[3] XOR X[6] XOR X[7] XOR X[2] XOR X[4]

Y107[1]=X[6] XOR X[4] XOR X[7] XOR X[3]

Y107[0]=X[5] XOR X[3] XOR X[6] XOR X[2]

The portion of the multiplication section that calculates $g_{14}X$ calculates the product $\alpha^{104}X=Y104$.

Y104[7]=X[7] XOR X[5] XOR X[4]

Y104[6]=X[6] XOR X[4] XOR X[7] XOR X[3]

Y104[5]=X[5] XOR X[3] XOR X[6] XOR X[2]

Y104[4]=X[4] XOR X[2] XOR X[5] XOR X[1]

Y104[3]=X[3] XOR X[7] XOR X[1] XOR X[5] XOR X[0]

Y104[2]=X[2] XOR X[6] XOR X[0] XOR X[5] XOR X[7]

Y104[1]=X[1] XOR X[7] XOR X[6]

Y104[0]=X[0] XOR X[6] XOR X[5]

Equations used to generate syndromes S1-S10 are provided below:

The multiplication section used to generate S1 implements the equations necessary to calculate the product of $\alpha^1 X=Y1$.

Y1[7]=X[6]

Y1[6]=X[5]

Y1[5]=X[4]

Y1[4]=X[7] XOR X[3]

Y1[3]=X[7] XOR X[2]

Y1[2]=X[7] XOR X[1]

Y1[1]=X[0]

Y1[0]=X[7]

The multiplication section used to generate S2 implements the equations necessary to calculate the product of $\alpha^2 X=Y2$.

Y2[7]=X[5]

Y2[6]=X[4]

Y2[5]=X[7] XOR X[3]

Y2[4]=X[6] XOR X[7] XOR X[2]

Y2[3]=X[6] XOR X[7] XOR X[1]

Y2[2]=X[6] XOR X[0]

Y2[1]=X[7]

Y2[0]=X[6]

The multiplication section used to generate S3 implements the equations necessary to calculate the product of $\alpha^3 X=Y3$.

Y3[7]=X[4]

Y3[6]=X[7] XOR X[3]

Y3[5]=X[6] XOR X[7] XOR X[2]

Y3[4]=X[5] XOR X[6] XOR X[7] XOR X[1]

Y3[3]=X[5] XOR X[6] XOR X[0]

Y3[2]=X[5] XOR X[7]

Y3[1]=X[6]

Y3[0]=X[5]

The multiplication section used to generate S4 implements the equations necessary to calculate the product of $\alpha^4 X = Y4$.

Y4[7]=X[7] XOR X[3]

Y4[6]=X[6] XOR X[7] XOR X[2]

Y4[5]=X[5] XOR X[6] XOR X[7] XOR X[1]

Y4[4]=X[4] XOR X[5] XOR X[6] XOR X[0]

Y4[3]=X[4] XOR X[5] XOR X[7]

Y4[2]=X[4] XOR X[6]

Y4[1]=X[5]

Y4[0]=X[4]

The multiplication section used to generate S5 implements the equations necessary to calculate the product of $\alpha^5 X = Y5$.

Y5[7]=X[6] XOR X[7] XOR X[2]

Y5[6]=X[5] XOR X[6] XOR X[7] XOR X[1]

Y5[5]=X[4] XOR X[5] XOR X[6] XOR X[0]

Y5[4]=X[3] XOR X[4] XOR X[5]

Y5[3]=X[7] XOR X[3] XOR X[4] XOR X[6]

Y5[2]=X[7] XOR X[3] XOR X[5]

Y5[1]=X[4]

Y5[0]=X[7] XOR X[3]

The multiplication section used to generate S6 implements the equations necessary to calculate the product of $\alpha^6 X = Y6$.

Y6[7]=X[5] XOR X[6] XOR X[7] XOR X[1]

Y6[6]=X[4] XOR X[5] XOR X[6] XOR X[0]

Y6[5]=X[3] XOR X[4] XOR X[5]

Y6[4]=X[2] XOR X[3] XOR X[4]

Y6[3]=X[6] XOR X[2] XOR X[3] XOR X[5]

Y6[2]=X[6] XOR X[7] XOR X[2] XOR X[4]

Y6[1]=X[7] XOR X[3]

Y6[0]=X[6] XOR X[7] XOR X[2]

The multiplication section used to generate S7 implements the equations necessary to calculate the product of $\alpha^7 X = Y7$.

Y7[7]=X[4] XOR X[5] XOR X[6] XOR X[0]

Y7[6]=X[3] XOR X[4] XOR X[5]

Y7[5]=X[2] XOR X[3] XOR X[4]

Y7[4]=X[7] XOR X[1] XOR X[2] XOR X[3]

Y7[3]=X[5] XOR X[1] XOR X[2] XOR X[4]

Y7[2]=X[5] XOR X[6] XOR X[1] XOR X[3]

Y7[1]=X[6] XOR X[7] XOR X[2]

Y7[0]=X[5] XOR X[6] XOR X[7] XOR X[1]

The multiplication section used to generate S8 implements the equations necessary to calculate the product of $\alpha^8 X = Y8$.

Y8[7]=X[3] XOR X[4] XOR X[5]

Y8[6]=X[2] XOR X[3] XOR X[4]

Y8[5]=X[7] XOR X[1] XOR X[2] XOR X[3]

Y8[4]=X[6] XOR X[0] XOR X[1] XOR X[2]

Y8[3]=X[4] XOR X[0] XOR X[1] XOR X[3]

Y8[2]=X[4] XOR X[5] XOR X[0] XOR X[7] XOR X[2]

Y8[1]=X[5] XOR X[6] XOR X[7] XOR X[1]

Y8[0]=X[4] XOR X[5] XOR X[6] XOR X[0]

The multiplication section used to generate S9 implements the equations necessary to calculate the product of $\alpha^9 X = Y9$.

Y9[7]=X[2] XOR X[3] XOR X[4]

Y9[6]=X[7] XOR X[1] XOR X[2] XOR X[3]

Y9[5]=X[6] XOR X[0] XOR X[1] XOR X[2]

Y9[4]=X[5] XOR X[0] XOR X[1]

Y9[3]=X[3] XOR X[0] XOR X[7] XOR X[2]

Y9[2]=X[3] XOR X[4] XOR X[6] XOR X[7] XOR X[1]

Y9[1]=X[4] XOR X[5] XOR X[6] XOR X[0]

Y9[0]=X[3] XOR X[4] XOR X[5]

The multiplication section used to generate S10 implements the equations necessary to calculate the product of $\alpha^{10} X = Y10$.

Y10[7]=X[7] XOR X[1] XOR X[2] XOR X[3]

Y10[6]=X[6] XOR X[0] XOR X[1] XOR X[2]

Y10[5]=X[5] XOR X[0] XOR X[1]

Y10[4]=X[4] XOR X[0] XOR X[7]

Y10[3]=X[2] XOR X[6] XOR X[7] XOR X[1]

Y10[2]=X[2] XOR X[3] XOR X[5] XOR X[6] XOR X[0]

Y10[1]=X[3] XOR X[4] XOR X[5]

Y10[0]=X[2] XOR X[3] XOR X[4]

The multiplication section used to generate S11 implements the equations necessary to calculate the product of $\alpha^{11}X = Y11$.

Y11[7]=X[6] XOR X[0] XOR X[1] XOR X[2]

Y11[6]=X[5] XOR X[0] XOR X[1]

Y11[5]=X[4] XOR X[0] XOR X[7]

Y11[4]=X[3] XOR X[6]

Y11[3]=X[7] XOR X[1] XOR X[5] XOR X[6] XOR X[0]

Y11[2]=X[7] XOR X[1] XOR X[2] XOR X[4] XOR X[5]

Y11[1]=X[2] XOR X[3] XOR X[4]

Y11[0]=X[7] XOR X[1] XOR X[2] XOR X[3]

The multiplication section used to generate S12 implements the equations necessary to calculate the product of $\alpha^{12}X = Y12$.

Y12[7]=X[5] XOR X[0] XOR X[1]

Y12[6]=X[4] XOR X[0] XOR X[7]

Y12[5]=X[3] XOR X[6]

Y12[4]=X[2] XOR X[7] XOR X[5]

Y12[3]=X[6] XOR X[0] XOR X[7] XOR X[4] XOR X[5]

Y12[2]=X[6] XOR X[0] XOR X[1] XOR X[3] XOR X[4]

Y12[1]=X[7] XOR X[1] XOR X[2] XOR X[3]

Y12[0]=X[6] XOR X[0] XOR X[1] XOR X[2]

The multiplication section used to generate S13 implements the equations necessary to calculate the product of $\alpha^{13}X = Y13$.

Y13[7]=X[4] XOR X[0] XOR X[7]

Y13[6]=X[3] XOR X[6]

Y13[5]=X[2] XOR X[7] XOR X[5]

Y13[4]=X[1] XOR X[6] XOR X[7] XOR X[4]

Y13[3]=X[5] XOR X[6] XOR X[3] XOR X[4]

Y13[2]=X[5] XOR X[0] XOR X[7] XOR X[2] XOR X[3]

Y13[1]=X[6] XOR X[0] XOR X[1] XOR X[2]

Y13[0]=X[5] XOR X[0] XOR X[1]

The multiplication section used to generate S14 implements the equations necessary to calculate the product of $\alpha^{14}X = Y14$.

Y14[7]=X[3] XOR X[6]

Y14[6]=X[2] XOR X[7] XOR X[5]

Y14[5]=X[1] XOR X[6] XOR X[7] XOR X[4]

Y14[4]=X[0] XOR X[7] XOR X[5] XOR X[6] XOR X[3]

Y14[3]=X[4] XOR X[5] XOR X[2] XOR X[3]

Y14[2]=X[4] XOR X[7] XOR X[6] XOR X[1] XOR X[2]

Y14[1]=X[5] XOR X[0] XOR X[1]

Y14[0]=X[4] XOR X[0] XOR X[7]

The multiplication section used to generate S15 implements the equations necessary to calculate the product of $\alpha^{15}X = Y15$.

Y15[7]=X[2] XOR X[7] XOR X[5]

Y15[6]=X[1] XOR X[6] XOR X[7] XOR X[4]

Y15[5]=X[0] XOR X[7] XOR X[5] XOR X[6] XOR X[3]

Y15[4]=X[6] XOR X[4] XOR X[5] XOR X[2]

Y15[3]=X[3] XOR X[4] XOR X[7] XOR X[1] XOR X[2]

Y15[2]=X[3] XOR X[6] XOR X[5] XOR X[0] XOR X[1]

Y15[1]=X[4] XOR X[0] XOR X[7]

Y15[0]=X[3] XOR X[6]

Although the present invention has been described with respect to specific embodiments thereof, various changes and modifications may be suggested to one skilled in the art. It is intended such changes and modifications fall within the scope of the appended claims.

What is claimed is:

1. A system comprising:
a Reed Solomon multiplication section comprising XOR-based logic, wherein
the XOR-based logic comprises an input, an output and a plurality of XOR gates coupled to receive X at the input and to generate a product of a power of $\alpha$ and X at the output,
X is a symbol, and
$\alpha$ is a root of a primitive polynomial of a Reed Solomon code, and
a portion of the XOR-based logic is configured to generate Y[7:0]=a product of X[7:0] and $\alpha^3$, and
the portion of the XOR-based logic comprises:
a first XOR gate configured to receive X[7] and x[3] as inputs and to output Y[6],
a second XOR gate configured to receive X[6], X[7], and X[2] as inputs and to output Y[5],
a third XOR gate configured to receive X[5], X[6], X[7], and X[1] as inputs and to output Y[4],
a fourth XOR gate configured to receive X[5], X[6], and X[0] as inputs and to output Y[3], and
a fifth XOR gate configured to receive X[5] and X[7] as inputs and to output Y[2].

2. The system of claim 1, further comprising:
a Reed Solomon encoder, wherein
the Reed Solomon encoder comprises the Reed Solomon multiplication section.

3. The system of claim 2, wherein the XOR-based logic is configured to generate a plurality of products, each of the products is a product of X and a respective one of a plurality of powers of α.

4. The system of claim 3, wherein
the Reed Solomon code is a RS(255, 239) code.

5. The system of claim 3, further comprising:
summing logic coupled to the XOR-based logic, wherein the summing logic is configured to generate a sum of the products.

6. The system of claim 3, wherein
the XOR-based logic comprises fewer logic gates than a general purpose Galois field multiplier configured for use in an encoder for RS(255, 239).

7. The system of claim 1, further comprising:
a plurality of Reed Solomon encoders, wherein
 each of the Reed Solomon encoders comprises a Reed Solomon multiplication section implemented from XOR-based logic.

8. The system of claim 1, further comprising:
a plurality of Reed Solomon syndrome generators, wherein
 each of the Reed Solomon syndrome generators comprises a Reed Solomon multiplication section implemented from XOR-based logic.

9. The system of claim 1, wherein
the Reed Solomon multiplication section further comprises a non-XOR-based multiplication device.

10. The system of claim 9, wherein
the non-XOR-based multiplication device comprises a Galois Field multiplier.

11. A system comprising:
a Reed Solomon multiplication section comprising XOR-based logic, wherein
 the XOR-based logic comprises an input, an output and a plurality of XOR gates coupled to receive X at the input and to generate a product of a power of α and X at the output.
 X is a symbol,
 α is a root of a primitive polynomial of a Reed Solomon code,
 the Reed Solomon syndrome generator is configured to generate an intermediate product Y[7:0] for use in calculating syndrome S1[7:0], and
 the Reed Solomon multiplication section comprises:
  a first XOR gate configured to receive X[7] and X[3] as inputs and to output Y[4],
  a second XOR gate configured to receive X[7] and X[2] as inputs and to output Y[3], and
  a third XOR gate configured to receive X[7] and X[1] as inputs and to output Y[2].

12. The system of claim 11, further comprising:
a Reed Solomon syndrome generator, wherein
 the Reed Solomon syndrome generator comprises the Reed Solomon multiplication section.

13. The system of claim 12, wherein
the Reed Solomon syndrome generator is configured to generate a syndrome for RS(255, 239).

14. A method comprising:
receiving a symbol X; and
calculating a product of X and a power of α, wherein
 the calculating is performed by XOR-based logic,
 the XOR-based logic comprises an input, an output and a plurality of XOR gates coupled to receive X at the input and to generate a product of a power of α and X at the output,
 α is a root of a primitive polynomial of a Reed Solomon code, and
 the calculating the product of X and the power of α comprises generating Y[7:0] to equal a product of X[7:0] and $\alpha^3$, wherein the generating comprises:
  receiving X[7] and X[3] as inputs to a first XOR gate,
  outputting Y[6] from the first XOR gate,
  receiving X[6], X[7], and X[2] as inputs to a second XOR gate,
  outputting Y[5] from the second XOR gate,
  receiving X[5], X[6], X[7], and X[1] as inputs to a third XOR gate,
  the third XOR gate outputting Y[4],
  receiving X[5], X[6], and X[0] as inputs to a fourth XOR gate,
  the fourth XOR gate outputting Y[3],
  receiving X[5] and X[7] as inputs to a fifth XOR gate, and
  outputting Y[2] from the first XOR gate.

15. The method of claim 14, wherein
a Reed Solomon encoder comprises the XOR-based logic.

16. The method of claim 15, further comprising:
generating a plurality of products, wherein
 each of the products is a product of X and a respective one of a plurality of powers of α.

17. The method of claim 16, wherein
the Reed Solomon code is a RS(255, 239) code.

18. The method of claim 16, further comprising:
generating a sum of the products.

19. The method of claim 16, wherein
the XOR-based logic comprises fewer logic gates than a general purpose Galois field multiplier configured for use in an encoder for RS(255, 239).

20. A method comprising:
receiving a symbol X; and
calculating a product of X and a power of α, wherein
 the calculating is performed by XOR-based logic,
 the XOR-based logic comprises an input, an output and a plurality of XOR gates coupled to receive X at the input and to generate a product of a power of α and X at the output, and
 α is a root of a primitive polynomial of a Reed Solomon code; and
generating a syndrome S1[7:0], wherein
 the generating the syndrome S1[7:0] comprises calculating an intermediate product Y[7:0] of X and the power of α, and
 the calculating the product of X and the power of α comprises:
  receiving X[7] and X[3] as inputs to a first XOR gate,
  outputting Y[4] from the first XOR gate,
  receiving X[7] and X[2] as inputs to a second XOR gate,
  outputting Y[3] from the second XOR gate,
  receiving X[7] and X[1] as inputs to a third XOR gate, and
  outputting Y[2] from the third XOR gate.

21. The method of claim 20, wherein
a Reed Solomon syndrome generator comprises the XOR-based logic.

22. The method of claim 21, wherein
the Reed Solomon syndrome generator is configured to generate a syndrome for RS(255, 239).

23. A method comprising:
generating information, wherein
the information indicates one or more XOR equations,
the XOR equations calculate a product Y of X and a power of $\alpha$,
$\alpha$ is a root of a primitive polynomial of a Reed Solomon code,
Y includes m bits, Y[m:0],
the information indicates m XOR equations, and
each of the m XOR equations calculates a respective Y[i], wherein $0<=i<=m-1$; and
storing the information.

24. The method of claim 23, further comprising:
receiving input indicating the power of $\alpha$, wherein
the generating is performed in response to the receiving.

25. The method of claim 23, wherein the generating information comprises:
identifying a linear sum of a one or more $\alpha^i$, wherein $0<=i<=m-1$, and
the linear sum equals the power of $\alpha$.

26. The method of claim 25, wherein the generating the information comprises:
combining equations used to generate respective products of X and each of the one or more $\alpha^i$.

27. The method of claim 25, wherein
m=8,
a first subset of the equations calculate a product Y1 of X and $\alpha^1$, and
the first subset of the equations comprise:

Y1[7]=X[6],

Y1[6]=X[5],

Y1[5]=X[4],

Y1[4]=X[7] XOR X[3],

Y1[3]=X[7] XOR X[2],

Y1[2]=X[7] XOR X[1],

Y1[1]=X[0], and

Y1[0]=X[7].

28. A computer readable medium comprising program instructions executable to:
generate information, wherein
the information indicates one or more XOR equations,
the XOR equations calculate a product Y of X and a power of $\alpha$, and
$\alpha$ is a root of a primitive polynomial of a Reed Solomon code,
Y includes m bits, Y[m-1:0],
the information indicates m XOR equations, and
each of the m XOR equations calculates a respective Y[i], wherein $0<=i<=m-1$; and
store the information.

29. The computer readable medium of claim 28, wherein the program instructions are executable to:
detect input indicating the power of $\alpha$, wherein
the generating is performed in response to the receiving.

30. The computer readable medium of claim 28, wherein generating the information comprises:
identifying a linear sum of a one or more $\alpha^i$, wherein $0<=i<=m-1$, and
the linear sum equals the power of $\alpha$.

31. The computer readable medium of claim 30, wherein the generating the information comprises:
combining equations used to generate respective products of X and each of the one or more $\alpha^i$.

32. The computer readable medium of claim 30, wherein
m=8,
a first subset of the equations calculate a product Y1 of X and $\alpha^1$, and
the first subset of the equations comprise:

Y1[7]=X[6],

Y1[6]=X[5],

Y1[5]=X[4],

Y1[4]=X[7] XOR X[3],

Y1[3]=X[7] XOR X[2],

Y1[2]=X[7] XOR X[1],

Y1[1]=X[0], and

Y1[0]=X[7].

* * * * *